(12) United States Patent
Waki et al.

(10) Patent No.: US 8,623,525 B2
(45) Date of Patent: Jan. 7, 2014

(54) CUTTING TOOL

(75) Inventors: Masahiro Waki, Satsumasendai (JP); Mitsuru Hasegawa, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/638,574

(22) PCT Filed: Mar. 28, 2011

(86) PCT No.: PCT/JP2011/057627
§ 371 (c)(1),
(2), (4) Date: Sep. 28, 2012

(87) PCT Pub. No.: WO2011/122553
PCT Pub. Date: Oct. 6, 2011

(65) Prior Publication Data
US 2013/0022420 A1    Jan. 24, 2013

(30) Foreign Application Priority Data

Mar. 29, 2010 (JP) .................. 2010-074581

(51) Int. Cl.
*B32B 9/00* (2006.01)
(52) U.S. Cl.
USPC ............... 428/697; 51/307; 51/309; 428/698; 428/699
(58) Field of Classification Search
USPC .............. 51/307, 309; 428/697, 698, 699
See application file for complete search history.

(56) References Cited

U.S. PATENT DOCUMENTS

| 6,586,122 | B2 * | 7/2003 | Ishikawa et al. ............. 428/698 |
| 6,767,658 | B2 * | 7/2004 | Yamamoto et al. ........... 428/698 |
| 6,838,151 | B2 * | 1/2005 | Kato ............................. 428/332 |
| 7,056,602 | B2 * | 6/2006 | Horling et al. ................ 428/697 |
| 7,083,868 | B2 * | 8/2006 | Horling et al. ................ 51/309 |
| 7,510,761 | B2 * | 3/2009 | Kondo et al. ................. 428/698 |
| 7,521,131 | B2 * | 4/2009 | Yamamoto .................... 428/699 |
| 7,811,683 | B2 * | 10/2010 | Zhu et al. ....................... 51/307 |
| 7,939,186 | B2 * | 5/2011 | Takaoka et al. ............... 428/697 |
| 8,062,776 | B2 * | 11/2011 | Waki et al. .................... 428/698 |
| 8,236,411 | B2 * | 8/2012 | Waki et al. .................... 428/697 |
| 2002/0176753 | A1 | 11/2002 | Kato |
| 2006/0163802 | A1 | 7/2006 | Reeves et al. |
| 2010/0129168 | A1 | 5/2010 | Waki et al. |

FOREIGN PATENT DOCUMENTS

| JP | 05-337705 | * 12/1993 |
| JP | 09-323204 | * 12/1997 |
| JP | 10-251831 | * 9/1998 |
| JP | 11-302831 | * 11/1999 |
| JP | 2002346812 | 12/2002 |

(Continued)

*Primary Examiner* — Archene Turner
(74) *Attorney, Agent, or Firm* — Schlee IP International, P.C.; Alexander R. Schlee

(57) ABSTRACT

A cutting tool having a high oxidation resistance, a high wear resistance and a good defect resistance. The cutting tool comprises a base body and a coating layer, the coating layer comprising $Ti_aAl_bM_d(C_{1-x}N_x)$, M being selected as at least one member selected from among Si, W, Nb, Mo, Ta, Hf, Cr, Zr and Y; and a, b, d and x satisfy the following requirements: $0.35 \leq a \leq 0.55$, $0.3 \leq b \leq 0.6$, $0 \leq d \leq 0.25$, $a+b+d=1$ and $0 \leq x \leq 1$. The Al content of a droplet on the coating layer of a cutting face is higher than the Al content of the composition of the coating layer, and the Ti content of a droplet on a flank face is higher than the Ti content of the composition of the coating layer.

4 Claims, 4 Drawing Sheets

(56) References Cited

FOREIGN PATENT DOCUMENTS

| | | | |
|---|---|---|---|
| JP | 2005-111574 | * | 4/2005 |
| JP | 2005-199420 | * | 7/2005 |
| JP | 2007-046103 | * | 2/2007 |
| JP | 2008-264975 | | 11/2008 |
| JP | 2009-066673 | * | 4/2009 |
| WO | 2009/119682 | | 1/2009 |

* cited by examiner

CUTTING TOOL

TECHNICAL FIELD OF THE INVENTION

The present invention relates to a cutting tool in which a coating layer is formed on surfaces of a substrate.

BACKGROUND OF THE INVENTION

Presently, wear resistance, sliding properties, and fracture resistance of cutting tools, wear-resistant members, and sliding members that are required to exhibit wear resistance, sliding properties, and fracture resistance are enhanced by using a technique of forming a coating layer on surfaces of a substrate composed of a sintered alloy such as a cemented carbide or cermet, a sintered high-hardness compact such as diamond or cubic boron nitride (cBN), or a ceramic such as alumina or silicon nitride.

Extensive studies have been conducted on methods for forming the coating layer in which a physical vapor deposition technique such as an arc ion plating technique or a sputtering technique is used to form a nitride layer containing Ti or Al as a main component, and continuous improvements have been made to extend tool life. Various innovations in addition to those related to the elements used in the coating materials have been applied to these surface-coated tools having coating layers in order to comply with changes in cutting environment such as increasing cutting speeds and diversification of workpieces.

For example, PTL 1 describes a surface-coated tool in which surfaces of a substrate are coated with a coating film such as TiAlN and that progress of welding and wear at a rake face can be suppressed and notch notch wear at a flank face can be suppressed by adjusting the Ti ratio in the flank face to be higher than the Ti ratio in the rake face.

PTL 2 describes formation of a TiAlN-based hard coating film having a thickness of 1 to 5 μm on surfaces of a substrate and that the hard coating film exhibits improved welding resistance and wear resistance since the area fraction of coarse particles that are larger than the film thickness and are present in the hard coating film is adjusted to be 5 area % or less, and the surface roughness Ra of the hard coating film is adjusted to 0.1 μm or less or the surface roughness Rz is adjusted to 1 μm or less.

PATENT LITERATURE

PTL 1: Japanese Unexamined Patent Application Publication No. 2008-264975
PTL 2: Japanese Unexamined Patent Application Publication No. 2002-346812

However, according to the configuration of PTL 1 in which the Ti ratio in the flank face is higher than the Ti ratio in the rake face, the heat resistance and oxidation resistance of the coating layer at the rake face are still insufficient and the fracture resistance at the flank face is also insufficient.

According to the configuration of PTL 2 in which the area percentage of the coarse particles is reduced as much as possible, because the surface roughness is small, chips directly hit the hard film, resulting in elevation of the temperature of the hard film, progress of crater wear, and a decrease in wear resistance.

The present invention has been made to address the problems described above and an object thereof is to provide a cutting tool that includes a coating layer that can exhibit locally optimum cutting performance.

SUMMARY OF THE INVENTION

A cutting tool according to the present invention comprising a cutting edge at a ridgeline between a rake face, a flank face and includes a substrate and a coating layer that coats surfaces of the substrate, the coating layer being composed of $Ti_aAl_bM_d(C_{1-x}N_x)$ (where M represents at least one element selected from the group consisting of Si, W, Nb, Mo, Ta, Hf, Cr, Zr, and Y, $0.35 \le a \le 0.55$, $0.3 \le b \le 0.6$, $0 \le d \le 0.25$, $a+b+d=1$, and $0 \le x \le 1$). Droplets are on a surface of the coating layer. An average composition of the droplets at the rake face has a higher content ratio of Al than the composition of the coating layer at the rake face, and an average composition of the droplets at the flank face has a higher content ratio of Ti than the composition of the coating layer at the flank.

DETAILED DESCRIPTION OF THE INVENTION

In this structure, the ratio of an average content ratio $Al_{DR}$ of Al in the droplets at the rake face to a content ratio $Al_{bR}$ of Al in the coating layer at the rake face is preferably $1.05 \le Al_{DR}/Al_{bR} \le 1.25$, and the ratio of an average content ratio $Ti_{DF}$ of Ti in the droplets at the flank face to a content ratio $Ti_{aF}$ of Ti in the coating layer at the flank is preferably $1.03 \le Ti_{DF}/Ti_{aF} \le 1.2$.

In this structure, $Ra_R$, $Rz_R$, $Ra_F$, and $Rz_F$ respectively satisfy $0.07 \text{ μm} \le Ra_R \le 0.3 \text{ μm}$, $0.3 \text{ μm} \le Rz_R \le 0.9 \text{ μm}$, $0.05 \text{ μm} \le Ra_F \le 0.15 \text{ μm}$, and $0.15 \text{ μm} \le Rz_F \le 0.6 \text{ μm}$, where $Ra_R$ represents an arithmetic mean surface roughness and $Rz_R$ represents a maximum height surface roughness of the coating layer at the rake face and $Ra_F$ represents an arithmetic mean surface roughness and $Rz_F$ represents a maximum height surface roughness of the coating layer at the flank face.

The coating layer has a multilayer structure in which a total of ten or more first coating layers represented by $Ti_{a1}Al_{b1}Md_1(C_{1-x1}N_{x1})$ (where $0 \le a1 \le 1$, $0 \le b1 \le 0.8$, $0 \le d1 \le 0.4$, $a1+b1+d1=1$, and $0 \le x \le 1$) and second coating layers represented by $Ti_{a2}Al_{b2}Md_2(C_{1-x2}N_{x2})$ (where $0 \le a2 \le 1$, $0 \le b2 \le 0.8$, $0 \le d2 \le 0.4$, and $a2+b2+d2=1$, but not $a1=a2$, $b1=b2$, and $d1=d2$) are alternately stacked.

Because the average composition of the droplets at the rake face on the coating layer formed on the surfaces of the substrate of the cutting tool of the present invention has a higher Al content than the composition of the coating layer at the rake surface, the hardness and oxidation resistance of the droplets at the rake face are increased. Accordingly, droplets do not immediately wear out despite the contact of chips with the droplets and thus chips do not directly hit the coating layer at the rake face. Moreover, because cutting oil penetrates gaps between the coating layer and the chip, the lubricity of the chips is improved. As a result, the temperature elevation of the coating layer at the rake face is suppressed and the crater wear is decreased.

The average composition of the droplets at the flank face has a larger average content ratio of Ti than the composition of the coating layer at the flank face, and, accordingly, the fracture toughness of the droplets on the surface at the flank is increased, the droplets on the surface of the coating layer at the flank face serve as a cushion material for absorbing the impact, and the impact on the coating layer can be reduced compared to when the impact is directly applied to the coating layer, and, in the result, the fracture resistance of the coating layer at the flank can be further improved.

When the ratio of the average content ratio $Al_{DR}$ of Al in the droplets at the rake face to the content ratio $Al_{bR}$ of Al in the coating layer at the rake face is $1.05 \le Al_{DR}/Al_{bR} \le 1.25$, the wear resistance at the rake face can be further enhanced. When the ratio of the average content ratio $Ti_{DF}$ of Ti in the droplets at the flank to the content ratio $Ti_{aF}$ of Ti in the coating layer at the flank face is $1.03 \le Ti_{DF}/Ti_{aF} \le 1.2$, the fracture resistance at the flank face can be further enhanced.

When $Ra_R$, which represents the arithmetic mean roughness of the coating layer at the rake face, is within the range of $0.07 \text{ μm} \le Ra_R \le 0.3 \text{ μm}$, the effects of suppressing the temperature elevation of the coating layer at the rake face and enhancing the wear resistance are high and the welding resistance can also be improved. When $Ra_F$, which represents the arithmetic mean roughness of the coating layer at the flank face, is within the range of 0.05 μm≤$Ra_F$≤0.15 μm, the surface roughness of the flank face is reduced and the surface of the workpiece after cutting can be satisfactorily finished. In order to enhance the effects brought by the existence of droplets, the maximum height surface roughness $Rz_R$ of the coating layer at the rake face and the maximum height surface roughness $Rz_F$ of the coating layer at the flank face are preferably 0.3 μm≤$Rz_R$≤0.9 μm and 0.15 μm≤$Rz_F$≤0.6 μm.

DETAILED DESCRIPTION OF THE DRAWINGS

Figure 1:
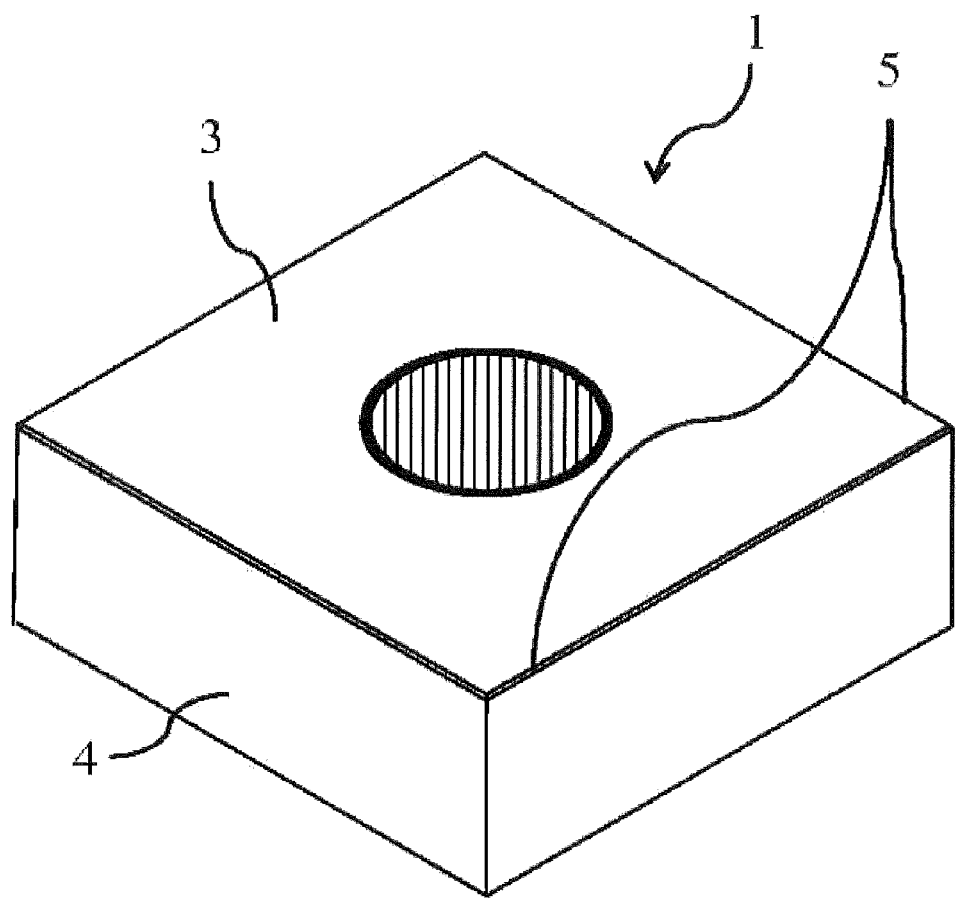
FIG. 1 is a schematic perspective view showing an example of a cutting tool of the present invention.

An example of a cutting tool of the present invention will now be described with reference to FIG. 1, which is a schematic perspective view of a cutting tool according to a preferred embodiment, FIG. 2, which is a schematic cross-sectional view of a first embodiment of the present invention, and FIGS. 3 and 4 which are scanning electron microscope (SEM) images of surfaces of a coating layer at a rake face and at a flank of the cutting tool shown in FIGS. 1 and 2.

Referring to FIGS. 1 to 4, a cutting tool (hereinafter simply referred to as "tool") 1 of the present invention has a rake face 3 as the major surface, flank faces 4 as side walls, cutting edges 5 at the ridgelines between the rake face 3 and the flank faces 4, and a coating layer 6 on surfaces of a substrate 2.

Figure 2:
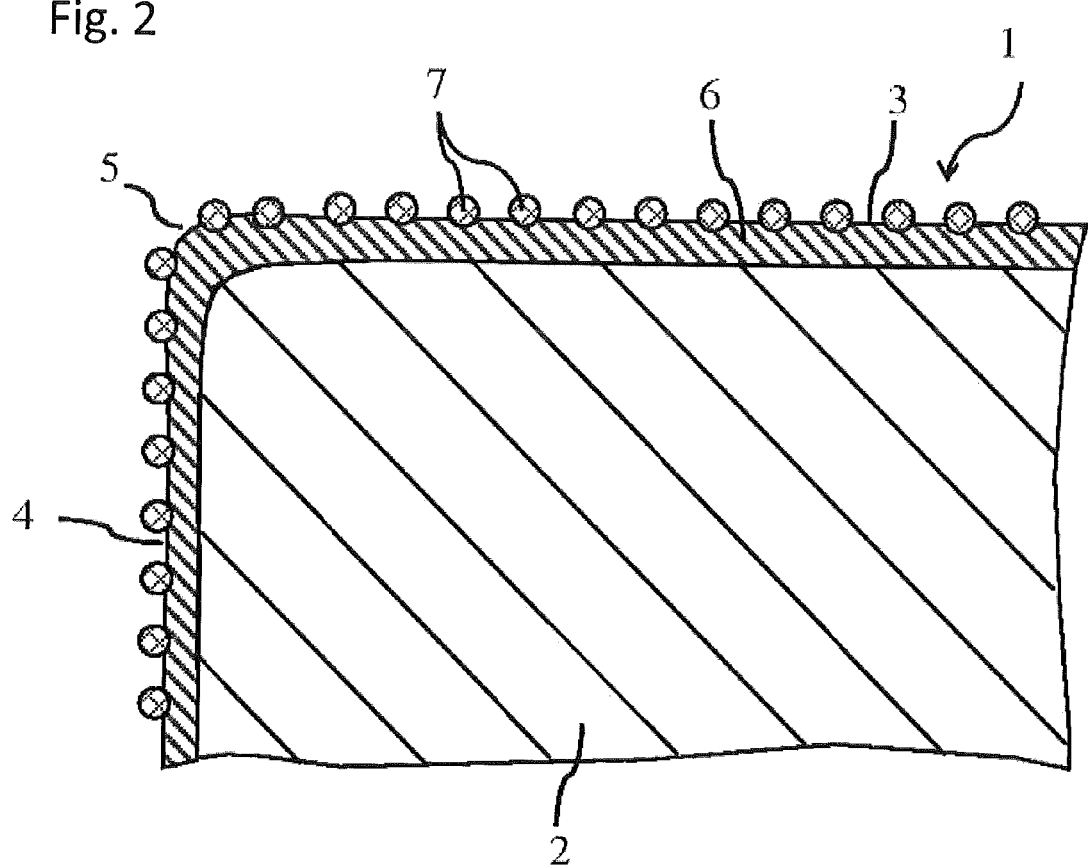
FIG. 2 is a schematic cross-sectional view showing a first embodiment of a cutting tool in FIG. 1.
Figure 3:
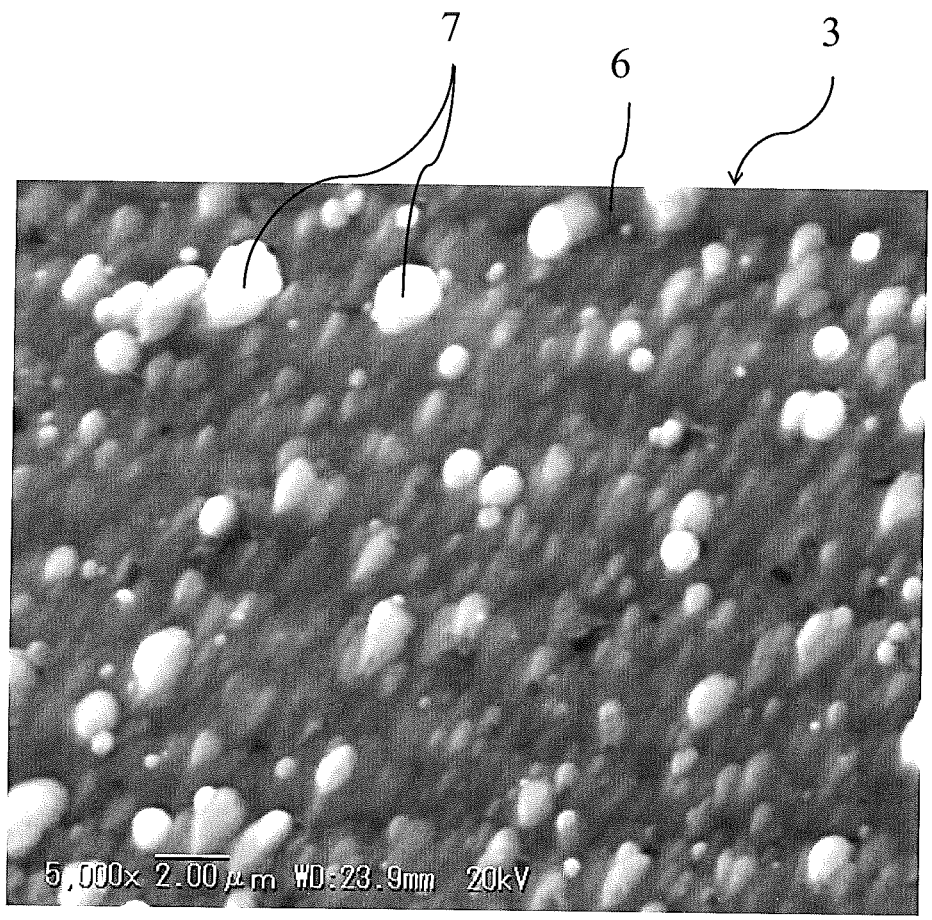
FIG. 3 is a SEM image of a surface of a coating layer at the rake face of the cutting tool in FIG. 1.
Figure 4:
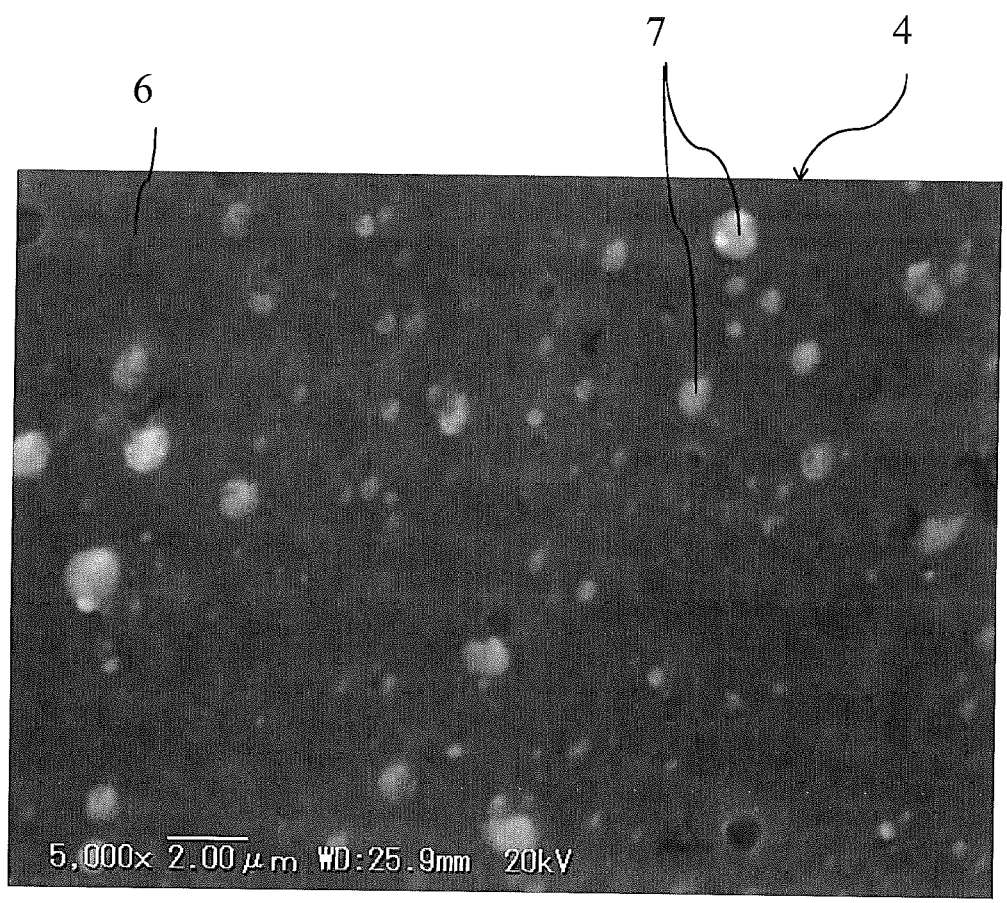
FIG. 4 is a SEM image of a surface of a coating layer at the flank of the cutting tool in FIG. 1.

As shown in FIGS. 2, 3, and 4, pieces of particulate matter called droplets 7 are found on the surface of the coating layer 6. It is important that the droplets 7 have an average composition such that the average content ratio $Al_{DR}$ of Al in the droplets 7 on the surface of the rake face 3 is higher than the content ratio $Al_{bR}$ of Al in the coating layer 6 at the rake face 3 and that the average content ratio $Ti_{DF}$ of Ti in the droplets 7 on the surface of the flank face 4 is higher than the content ratio $Ti_{aF}$ of Ti in the coating layer 6 at the flank face 4.

In this manner, the droplets 7 remain unworn for a long period of time despite the passing of chips over the droplets 7 having high hardness on the surface of the coating layer 6 at the rake face 3 during cutting, so the chips do not directly hit the surface of the coating layer 6 at the rake face 3 and the elevation of the temperature of the coating layer 6 can be suppressed. Since a sufficient amount of cutting oil can be retained between the coating layer 6 and the chips during cutting, the chips can be smoothly removed. As a result, the temperature elevation of the coating layer 6 can be further suppressed and the progress of the crater wear at the rake face 3 can be suppressed. Because the average content ratio $Ti_{DF}$ of Ti in the droplets 7 on the surface of the coating layer 6 at the flank face 4 is higher than the content ratio $Ti_{aF}$ of Ti in the coating layer 6 at the flank face 4, the droplets 7 on the surface of the coating layer 6 at the flank 4 serve as a cushioning material. Thus, the impact on the coating layer 6 can be reduced, the fracture resistance of the coating layer 6 can be improved, and the surface roughness of the finishing surface of a workpiece can be reduced. The metal component contents in the coating layer can be measured by energy-dispersive spectroscopy (EDS) of electron probe microanalysis (EPMA) or X-ray photoelectron spectroscopy (XPS).

The content ratio $Al_{DR}$ of Al in the droplets 7 on the surface of the coating layer 6 at the rake face 3 preferably satisfies 1.05≤$Al_{DR}$/$Al_{bR}$≤1.25 relative to the content ratio $Al_{bR}$ of Al the coating layer 6 at the rake face 3. When the ratio $Al_{DR}$/$Al_{bR}$ is 1.05 or more, the heat resistance and oxidation resistance of the droplets 7 are improved. When the ratio $Al_{DR}$/$Al_{bR}$ is 1.25 or less, the crystal structure of the droplets 7 does not change from cubic to hexagonal and the wear resistance is high. A particularly preferable range of the ratio $Al_{DR}$/$Al_{bR}$ is 1.06≤$Al_{DR}$/$Al_{bR}$≤1.15.

The average content ratio $Ti_{DF}$ of Ti in the droplets 7 on the coating layer 6 at the flank face 4 preferably satisfies 1.03≤$Ti_{DF}$/$Ti_{aF}$≤1.2 relative to the content ratio $Ti_{aF}$ of Ti in the coating layer 6 at the flank face 4. When the ratio $Ti_{DF}$/$Ti_{aF}$ is 1.05 or more, the fracture toughness of the droplets 7 on the flank 4 is improved and thus chipping or fractures of the cutting tool 1 are prevented during cutting and the finishing surface of the workpiece becomes smooth. When the ratio $Ti_{DF}$/$Ti_{aF}$ is 1.2 or less, wear of the flank face during cutting can be suppressed without degrading the hardness and heat resistance of the droplets 7 on the flank 4. A particularly preferable range of the ratio $Ti_{DF}$/$Ti_{aF}$ is 1.05≤$Ti_{DF}$/$Ti_{aF}$≤1.12.

When the arithmetic mean roughness $Ra_R$ of the coating layer 6 at the rake face 3 is within the range of 0.07 μm≤$Ra_R$≤0.3 μm, the effects of suppressing temperature elevation of the coating layer 6 at the rake face 3 and enhancing the wear resistance are high and the welding resistance can also be improved. When the arithmetic mean roughness $Ra_F$ of the coating layer 6 at the flank 4 is within the range of 0.05 μm≤$Ra_F$≤0.15 μm, the surface of the workpiece after working can be satisfactorily finished. In order to enhance these effects induced by the presence of the droplets, $Rz_R$ preferably satisfies 0.3 μm≤$Rz_R$≤0.9 μm and $Rz_F$ preferably satisfies 0.15 μm≤$Rz_F$≤0.6 μm, where $Rz_R$ is a maximum height surface roughness of the coating layer at the rake face and $Rz_F$ is a maximum height surface roughness of the coating layer at the flank face.

The composition of the coating layer 6 at the rake face is $Ti_aAl_bM_d(C_{1-x}N_x)$ (where M represents at least one element selected from the group consisting of Si, W, Nb, Mo, Ta, Cr, Zr, Hf, and Y, 0.35≤a≤0.55, 0.3≤b≤0.6, 0.0≤d≤0.25, and 0≤x≤1). When the coating layer 6 is within this composition range, the oxidation onset temperature of the coating layer 6 rises, the oxidation resistance is increased, the internal stress can be reduced, and the fracture resistance is enhanced. Moreover, since the coating layer 6 has high hardness and high adhesion to the substrate 2, the coating layer 6 exhibits good wear resistance and good fracture resistance under severe cutting conditions such as machining of difficult-to-cut materials, dry cutting, and high-speed cutting.

That is, when a (Ti composition ratio) in the coating layer 6 is smaller than 0.35, the crystal structure of the coating layer 6 changes from cubic to hexagonal the hardness is decreased, resulting in wear resistance. When a (Ti composition ratio) is larger than 0.55, the oxidation resistance and heat resistance of the coating layer 6 are decreased. A particularly preferable range for a is 0.45≤a≤0.5. When b (Al content) is smaller than 0.3, the oxidation resistance and heat resistance of the coating layer 6 are decreased. When b (Al composition ratio) is larger than 0.6, the crystal structure of the coating layer 6 tends to change from cubic to hexagonal and thus the hardness is decreased. A particularly preferable range for b is 0.48≤b≤0.52. When the thickness of the coating layer is small, i.e., 50 nm or less, the cubic crystal structure can be maintained in some cases with b larger than 0.6 depending on the configuration of the layers stacked on or under the coating layer. When d (metal M composition ratio) is larger than 0.25, the oxidation resistance in the coating layer 6 is degraded or the wear resistance is decreased due to the decrease in hardness. A particularly preferable range for d is $0.01 \leq d \leq 0.22$.

The metal M is at least one element selected from the group consisting of Si, W, Nb, Mo, Ta, Hf, Cr, Zr, and Y. Among these, Si or W is preferably incorporated to achieve good hardness and Nb or Mo is preferably incorporated to achieve highest wear resistance and oxidation resistance.

Non-metal components, C and N, of the coating layer 6 help develop hardness and toughness required for cutting tools and a particularly preferable range for x (N composition ratio) is $0.5 \leq x \leq 1$.

Alternatively, the coating layer 6 may comprise a multi-layer structure in which a total of 10 or more first coating layers represented by $Ti_{a1}Al_{b1}Md_1(C_{1-x}N_{x1})$ (where $0 \leq a1 \leq 1$, $0 \leq b1 \leq 0.8$, $0 \leq d1 \leq 0.4$, $a1+b1+d1=1$, and $0 \leq x \leq 1$) and second coating layers represented by $Ti_{a2}Al_{b2}M_{d2}(C_{1-x2}N_{x2})$ (where $0 \leq a2 \leq 1$, $0 \leq b2 \leq 0.8$, $0 \leq d2 \leq 0.4$, and $a2+b2+d2=1$, but not $a1=a2$, $b1=b2$, and $d1=d2$) are alternately stacked.

A physical vapor deposition (PVD) method such as an ion plating method or a sputtering method can be applied to form the surface coating layer 6, and an arc ion plating method is preferably used as a method for forming these droplets 7 on the surface of the coating layer 6.

The substrate 2 is preferably made of a hard material such as hard alloys such as cemented carbide and cermet having a hard phase made of tungsten carbide or titanium carbonitride as a main component and a bonding phase made of an iron-group metal such as cobalt or nickel as a main component, ceramics made of silicon nitride or aluminum oxide as a main component, or an ultra-high-pressure sintered bodies prepared by firing a hard phase made of polycrystalline diamond or cubic boron nitride and a bonding phase such as ceramic or an iron-group metal under high pressure.

Production Method

A method for producing a cutting tool according to the present invention will now be described.

First, a substrate having a tool shape is prepared by a known method. Next, a coating layer is formed on surfaces of the substrate. A physical vapor deposition (PVD) method such as an ion plating method or a sputtering method is suitable as a method for forming the coating layer. An example of the film-forming method is described in detail. When the coating layer is to be prepared by an ion plating method, metal targets respectively independently containing metallic titanium (Ti), metallic aluminum (Al), and, if needed, metal M (where M is at least one element selected from the group consisting of Si, W, Nb, Mo, Ta, Hf, Cr, Zr, and Y), an alloy target in which these elements are compounded, or a sintered target is set at a position on a side wall of a chamber.

At this stage, in the present invention, in addition to the targets containing these metals, sub targets respectively containing larger amounts of Al or Ti than the above-described targets are separately prepared, the sub target containing a larger amount of Al component is set at a position on the upper wall of the chamber, and the sub target containing a larger amount of Ti component is set at a position on the side wall of the chamber. Then a film is formed under conditions described below. As a result, the average composition of the coating layer formed and the average composition of the droplets can be adjusted to be the composition as specified in the present invention. When a sintered target prepared by a method of sintering a mixture of metal powders is used, the amount of droplets precipitating on the surface of the coating layer tends to increase compared to when an alloy target prepared by melting the metal components and re-solidifying the melted metal components is used.

Regarding the deposition conditions, a coating layer and droplets are formed by an ion plating method or a sputtering method with which metal sources are evaporated and ionized by arc discharge or glow discharge using these targets while allowing the evaporated and ionized metal sources to react with a nitrogen source, i.e., nitrogen ($N_2$) gas, or a carbon source, i.e., methane ($CH_4$)/acetylene ($C_2H_2$) gas. During this process, the substrate is set such that the flank faces are substantially parallel to the side walls of the chamber and the rake face is substantially parallel to the upper wall of the chamber. When an arc current of 100 to 200 A is supplied to the main targets, an arc current of 70 to 150 A is supplied to the sub target containing a larger amount of Ti component on the side wall, and an arc current of 150 to 250 A is supplied to the sub target containing a larger amount of Al component on the upper wall, the composition of the coating layer and the average composition of the droplets can be controlled to be different from each other. Moreover, the droplets at the rake face can be adjusted to have a higher average content ratio of Al than the composition of the coating layer at the rake face, the average composition of the droplets at the flank face can be adjusted to have a higher average content ratio of Ti than the composition of the coating layer at the flank face. Note that an arc current is supplied to the sub target containing a large amount of Ti component on the side wall only immediately before finishing the deposition.

In forming the coating layer by an ion plating method or a sputtering method, a bias voltage of 20 to 200 V is preferably applied by considering the crystal structure of the coating layer in order to prepare a coating layer having a high hardness and to increase the adhesion of the coating layer to the substrate.

In order to form a coating layer having the above-described multilayer structure, two composition targets, that is, a first target having a composition close to the composition of first coating layers and a second target having a composition close to the composition of second coating layers are attached to a side wall of the deposition apparatus, a target for adjusting the droplet composition is attached to the upper wall of the chamber and at a position close to the first target or the second target, and the film deposition is conducted while rotating the sample inside the apparatus.

EXAMPLE 1

In order to preparing a cemented carbide, tungsten carbide (WC) powder having an average particle diameter of 0.8 μm as a main component, 10 mass % of a metallic cobalt (Co) powder having an average particle diameter of 1.2 μm, 0.1 mass % of vanadium carbide (VC) powder having an average particle diameter of 1.0 μm, and 0.3 mass % of chromium carbide ($Cr_3C_2$) powder having an average particle diameter of 1.0 μm were mixed, and the mixture was press-formed into a DCGT11T302 MFCQ throw-away-tip-shaped compact, and then, the compact was subjected to a debinding treatment and fired in a 0.01 Pa vacuum at 1450° C. for 1 hour. The surface of the rake face surface of each sample was polished by blasting, brushing, or the like. The resulting cemented carbide was subjected to a honing treatment by brushing.

A coating layer having a composition shown in Table 2 was formed in a manner such that the deposition temperature and the bias voltage shown in Table 1 were applied to the resulting substrate. Arc currents shown in Table 1 were respectively supplied to a main target, a sub target on a side wall, and a sub target on an upper wall. The arc current was supplied to the sub target containing a larger amount of Ti on the side wall only immediately before finishing the deposition

TABLE 1

| Sample No. | Main target Composition | Arc current (A) | Sub target (upper wall) Composition | Arc current (A) | Sub target (side wall) Composition | Arc current (A) | Deposition conditions Bias Voltage (V) | Deposition Temperate (°C.) |
|---|---|---|---|---|---|---|---|---|
| I-1  | TiAlWNbSi | 140 | AlNb  | 150 | TiW  | 100 | 50  | 500 |
| I-2  | TiAlW     | 130 | AlHf  | 130 | Ti   | 110 | 35  | 500 |
| I-3  | TiAlMo    | 190 | Al    | 220 | TiMo | 130 | 120 | 550 |
| I-4  | TiAlSiCr  | 200 | AlCrW | 150 | Ti   | 110 | 180 | 530 |
| I-5  | TiAlZr    | 185 | Al    | 240 | Ti   | 70  | 100 | 500 |
| I-6  | TiAlNbY   | 125 | Al    | 200 | Ti   | 120 | 70  | 520 |
| I-7  | TiAl      | 150 | Al    | 120 | Ti   | 130 | 50  | 500 |
| I-8  | TiAlW     | 120 | AlSi  | 190 | TiW  | 100 | 60  | 500 |
| I-9  | TiAlW     | 135 | AlCrW | 150 | Ti   | 110 | 100 | 550 |
| I-10 | TiAlNb    | 100 | Al    | 170 | Ti   | 120 | 140 | 500 |
| I-11 | TiAlNbWSi | 150 | —     |     | Ti   | 120 | 75  | 520 |
| I-12 | TiAlMoW   | 175 | Al    | 140 | —    |     | 120 | 450 |

For each of the resulting samples, the composition of three freely selected points on a surface of a coating layer at the rake face, the composition of three freely selected points on a surface of a coating layer at the flank, the average composition of ten droplets 3 μm or larger in diameter on the surface at the rake face, and the average composition of ten droplets 3 μm or larger in diameter on the surface at the flank face were measured with an energy-dispersive spectroscope (EDS) (EDAX produced by AMETEK Inc.). The averages were taken therefrom to determine the compositions of the coating layer at the rake face and at the flank face and the average compositions of the droplets on the surface at the rake face and the flank face. From each of the rake face and the flank face, three positions 2 mm in length were analyzed by using a stylus-type surface roughness meter (SURFCOM produced by Tokyo Seimitsu Co., Ltd.) and the averages were taken to determine $Ra_R$, $Rz_R$, $Ra_F$, and $Rz_F$. In measuring the surface roughness, the cut-off value was set to 0.25 mm and the evaluation length was set to 1.25 mm.

TABLE 2

| Sample No. | Coating layer Composition | Rake face $Al_{DR}$ | $Al_{DR}/Al_{bR}$ | $Ra_R$ (μm) | $Rz_R$ (μm) | Flank face $Ti_{DF}$ | $Ti_{DF}/Ti_{aF}$ | $Ra_F$ (μm) | $Rz_F$ (μm) |
|---|---|---|---|---|---|---|---|---|---|
| I-1  | $Ti_{0.46}Al_{0.49}Nb_{0.02}W_{0.02}Si_{0.01}N$ | 0.54 | 1.1  | 0.15 | 0.84 | 0.62 | 1.12 | 0.12 | 0.53 |
| I-2  | $Ti_{0.40}Al_{0.43}W_{0.07}Hf_{0.1}N$           | 0.45 | 1.05 | 0.09 | 0.61 | 0.57 | 1.18 | 0.12 | 0.54 |
| I-3  | $Ti_{0.39}Al_{0.55}Mo_{0.06}N$                  | 0.66 | 1.20 | 0.27 | 1.32 | 0.56 | 1.20 | 0.18 | 0.61 |
| I-4  | $Ti_{0.44}Al_{0.51}Si_{0.03}Cr_{0.02}N$         | 0.59 | 1.15 | 0.12 | 0.56 | 0.58 | 1.10 | 0.05 | 0.19 |
| I-5  | $Ti_{0.52}Al_{0.46}Zr_{0.02}N$                  | 0.61 | 1.32 | 0.28 | 1.53 | 0.65 | 1.04 | 0.16 | 0.63 |
| I-6  | $Ti_{0.43}Al_{0.55}Nb_{0.01}Y_{0.01}N$          | 0.68 | 1.24 | 0.21 | 0.67 | 0.61 | 1.18 | 0.18 | 0.69 |
| I-7  | $Ti_{0.50}Al_{0.50}N$                           | 0.52 | 1.03 | 0.06 | 0.41 | 0.74 | 1.23 | 0.18 | 0.65 |
| I-8  | $Ti_{0.41}Al_{0.53}W_{0.04}Si_{0.02}N$          | 0.60 | 1.13 | 0.18 | 0.49 | 0.57 | 1.15 | 0.10 | 0.32 |
| I-9  | $Ti_{0.40}Al_{0.45}Cr_{0.05}W_{0.1}N$           | 0.49 | 1.08 | 0.09 | 0.55 | 0.57 | 1.18 | 0.13 | 0.54 |
| I-10 | $Ti_{0.37}Al_{0.53}Nb_{0.1}Co_{0.2}N_{0.8}$     | 0.59 | 1.11 | 0.23 | 0.84 | 0.49 | 1.10 | 0.11 | 0.49 |
| I-11 | $Ti_{0.31}Al_{0.50}Nb_{0.09}W_{0.07}Si_{0.03}N$ | 0.50 | 0.99 | 0.22 | 0.76 | 0.04 | 0.12 | 0.24 | 0.53 |
| I-12 | $Ti_{0.58}Al_{0.37}Mo_{0.04}W_{0.01}N$          | 0.50 | 1.35 | 0.19 | 0.95 | 0.70 | 1.00 | 0.24 | 0.60 |

A cutting test was conducted by using the resulting throw-away tips having the shape of an outside turning cutting tool DCGT11T302 MFCQ under cutting conditions described below. The results are shown in Table 3.
Cutting method: outside turning
Workpiece: carbon steel (S45C)
Cutting speed: 120 m/min
Feeding rate: 0.05 mm/rev
Notch: 1.2 mm
Cutting condition: wet
Evaluation method: After 180 minutes of cutting, presence or absence of crater wear at the rake face and of chipping were observed with an optical microscope. The surface roughness of the workpiece was measured as an arithmetic mean roughness Ra using a contact-type surface roughness meter (SURFCOM produced by Tokyo Seimitsu Co., Ltd.).

TABLE 3

| Sample No. | Results of cutting Roughness of work surface (μm) | Number of work (mm) | Condition of cutting edge |
|---|---|---|---|
| I-1  | 0.62 | 1850 | Good |
| I-2  | 1.04 | 1244 | Good |
| I-3  | 1.23 | 1044 | Good |
| I-4  | 0.72 | 1560 | Good |
| I-5  | 1.25 | 1042 | Slight chipping |
| I-6  | 0.85 | 1340 | Good |
| I-7  | 1.41 | 1032 | Slight crater wear |
| I-8  | 0.78 | 1400 | Good |

TABLE 3-continued

| Sample No. | Results of cutting Roughness of work surface (μm) | Number of work (mm) | Condition of cutting edge |
|---|---|---|---|
| I-9  | 0.95 | 1250 | Good |
| I-10 | 0.92 | 1310 | Good |
| I-11 | 1.94 | 952  | Large crater wear |
| I-12 | 2.15 | 482  | Fracture |

Based on the results shown in Tables 1 to 3, Sample No. I-11 in which the average content ratio $Al_{DR}$ of Al in the droplets at the rake face was less than or equal to the content ratio $Al_{bR}$ of Al in the coating layer at the rake face exhibited low wear resistance. Sample No. I-12 in which the average content ratio of Ti in the droplets at the flank face was equal to the content ratio of Ti in the coating layer at the flank face fractured and had a short tool life.

In contrast, the coating layers of Samples Nos. I-1 to I-10 within the ranges of the present invention all had good fracture resistance and good oxidation resistance, and good cutting performance was achieved.

EXAMPLE 2

Coating layers shown in Table 4 were deposited as in Example 1 on the cutting inserts substrates of Example 1 by installing three types of targets, i.e., two on the side walls and one on the upper wall, as shown in Table 4. Sintered targets were used as the main targets and one main target was set on each of side walls of the chamber. Alloy targets or sintered targets of the metals described in Table 4 were used as the sub targets and one sub target is set to a wall of the chamber at a position indicated in Table 4.

TABLE 5

| Sample No. | Coating layer (whole) | Coating layer (detail) |
|---|---|---|
| II-1 | $Ti_{0.46}Al_{0.46}Nb_{0.05}W_{0.01}Si_{0.02}N$ | $Ti_{0.46}Al_{0.49}Nb_{0.02}W_{0.02}Si_{0.01}N$ $Ti_{0.40}Al_{0.30}Nb_{0.20}Si_{0.10}N$ |
| II-2 | $Ti_{0.50}Al_{0.33}W_{0.07}Hf_{0.10}N$ | $Ti_{0.40}Al_{0.43}W_{0.07}Hf_{0.1}N$ $Ti_{0.80}Al_{0.20}N$ |
| II-3 | $Ti_{0.39}Al_{0.55}Mo_{0.03}Nb_{0.03}N$ | $Ti_{0.39}Al_{0.55}Mo_{0.06}N$ $Ti_{0.40}Al_{0.50}Nb_{0.10}N$ |
| II-4 | $Ti_{0.44}Al_{0.51}Nb_{0.03}Si_{0.01}Cr_{0.01}N$ | $Ti_{0.44}Al_{0.51}Si_{0.03}Cr_{0.02}N$ $Ti_{0.40}Al_{0.50}Nb_{0.10}N$ |

TABLE 4

| Sample No. | Main target 1 Composition | Main target 1 Arc current (A) | Main target 2 Composition | Main target 2 Arc current (A) | Sub target (upper wall) Composition | Sub target (upper wall) Arc current (A) | Sub target (side wall) Composition | Sub target (side wall) Arc current (A) | Bias voltage (V) | Deposition temperature (°C.) |
|---|---|---|---|---|---|---|---|---|---|---|
| II-1 | TiAlWNbSi | 140 | TiAlNbSi | 150 | AlNb | 150 | TiW | 100 | 50 | 500 |
| II-2 | TiAlW | 130 | TiAl | 130 | AlHf | 130 | Ti | 110 | 35 | 500 |
| II-3 | TiAl | 190 | TiAlNb | 170 | Al | 220 | TiMo | 130 | 120 | 550 |
| II-4 | TiAlSiCr | 200 | TiAlNb | 150 | AlCrW | 150 | Ti | 110 | 180 | 530 |

Regarding the resulting inserts, a quantative analysis of the compositions of the coating layers and the droplets was conducted as in Example 1 and $Ra_R$, $Rz_R$, $Ra_F$, and $Rz_F$ were determined. The results are shown in Tables 5 and 6. After the coating layers were observed with a transmission electron microscope (TEM), a strucutre in which first layers (upper side) and second layers (lower side) having compositions in Table 5 (in the (detail) column) were stacked at an interval of 10 nm or less in thickness was observed as a result. A cutting test was also conduted on the inserts under the same cutting conditions as in Example 1. The results are shown in Table 6.

TABLE 6

| Sample No. | Rake face $Al_{DR}$ | Rake face $Al_{DR}/Al_{bR}$ | Rake face $Ra_R$ (µm) | Rake face $Rz_R$ (µm) | Flank face $Ti_{DF}$ | Flank face $Ti_{DF}/Ti_{aF}$ | Flank face $Ra_F$ (µm) | Flank face $Rz_F$ (µm) | Cutting results Finishing surface roughness (µm) | Cutting results Number of work (mm) | Cutting results Condition of cutting edge |
|---|---|---|---|---|---|---|---|---|---|---|---|
| II-1 | 0.51 | 1.1 | 0.13 | 0.86 | 0.52 | 1.12 | 0.11 | 0.54 | 0.60 | 1960 | Good |
| II-2 | 0.35 | 1.05 | 0.09 | 0.6 | 0.59 | 1.18 | 0.12 | 0.57 | 1.00 | 1300 | Good |
| II-3 | 0.66 | 1.20 | 0.25 | 1.29 | 0.47 | 1.20 | 0.17 | 0.56 | 1.12 | 1090 | Good |
| II-4 | 0.59 | 1.15 | 0.11 | 0.54 | 0.48 | 1.1 | 0.06 | 0.22 | 0.68 | 1630 | Good |

Based on Tables 4 to 6, coating layers of Samples Nos. II-1 to II-4 in which the average content ratio of Al in the droplets at the rake face is higher than the content ratio of Al in the coating layer at the rake face all exhibited good fracture resistance and good oxidation resistance, and good cutting performance was achieved.

REFERENCE NUMERAL LIST 1 cutting tool
2 substrate
3 rake face
4 flank face
5 cutting edge
6 coating layer
7 droplet

The invention claimed is:

1. A cutting tool comprising:
a cutting tool substrate provided with a rake face and a flank face;
a cutting edge at a ridgeline between the rake face and the flank face;
a coating layer that coats surfaces of the substrate including the rake face and the flank face, wherein the coating layer comprises $Ti_aAl_bM_d(C_{1-x}N_x)$, (M being selected as at least one element from the group consisting of Si, W, Nb, Mo, Ta, Hf, Cr, Zr, and Y, in the content ranges of $0.35 \leq a \leq 0.55$, $0.3 \leq b \leq 0.6$, $0 \leq d \leq 0.25$, $a+b+d=1$, and $0 \leq x \leq 1$); and
droplets on a surface of the coating layer, wherein said:
droplets at the rake face have a higher average content ratio of Al than the coating layer at the rake face, and
droplets at the flank face have a higher average content ratio of Ti than the coating layer at the flank face.

2. The cutting tool according to claim 1, wherein a ratio of an average content ratio $Al_{DR}$ of Al in the droplets at the rake face to a content ratio $Al_{bR}$ of Al in the coating layer at the rake face is $1.05 \leq Al_{DR}/Al_{bR} \leq 1.25$, and a ratio of an average content ratio $Ti_{DF}$ of Ti in the droplets at the flank face to a content ratio $Ti_{aF}$ of Ti in the coating layer at the flank face is $1.03 \leq Ti_{DF}/Ti_{aF} \leq 1.2$.

3. The cutting tool according to claim 1, wherein $Ra_R$, $Rz_R$, $Ra_F$, and $Rz_F$ respectively satisfy $0.07\ \mu m \leq Ra_R \leq 0.3\ \mu m$, $0.3\ \mu m \leq Rz_R \leq 0.9\ \mu m$, $0.05\ \mu m \leq Ra_F \leq 0.15\ \mu m$, and $0.15\ \mu m \leq Rz_F \leq 0.6\ \mu m$, where $Ra_R$ represents an arithmetic mean surface roughness and $Rz_R$ represents a maximum height surface roughness of the coating layer at the rake face and $Ra_F$ represents an arithmetic mean surface roughness and $Rz_F$ represents a maximum height surface roughness of the coating layer at the flank face.

4. The cutting tool according to claim 1, wherein the coating layer has a multilayer structure of first and second partial coating layers in which a total of ten or more of the first partial coating layers and the second partial coating layers are alternately stacked, the first partial coating layers comprising $Ti_{a1}Al_{b1}M_{d1}(C_{1-x1}N_{x1})$, M being selected as at least one element from the group consisting of Si, W, Nb, Mo, Ta, Hf, Cr, Zr, and Y in the content ranges of $0 \leq a1 \leq 1$, $0 \leq b1 \leq 0.8$, $0 \leq d1 \leq 0.4$, $a1+b1+d1=1$, and $0 \leq x \leq 1$ and the second partial coating layers comprising $Ti_{a2}Al_{b2}M_{d2}(C_{1-x2}N_{x2})$, where M being selected as at least one element from the group consisting of Si, W, Nb, Mo, Ta, Hf, Cr, Zr, and Y in the content ranges of $0 \leq a2 \leq 1$, $0 \leq b2 \leq 0.8$, $0 \leq d2 \leq 0.4$, and $a2+b2+d2=1$, but not $a1=a2$, not $b1=b2$, and not $c1=c2$.

* * * * *

UNITED STATES PATENT AND TRADEMARK OFFICE
CERTIFICATE OF CORRECTION

PATENT NO. : 8,623,525 B2
APPLICATION NO. : 13/638574
DATED : January 7, 2014
INVENTOR(S) : Masahiro Waki and Mitsuru Hasegawa It is certified that error appears in the above-identified patent and that said Letters Patent is hereby corrected as shown below:

In the specification,

Column 2, line 31 reads:

$(C_{1-x1}N_{x1})$ (where $0 \leq a1 \leq 1$, $0 \leq b1 \leq 0.8$, $0 \leq d1 \leq 0.4$, $a1 + b1 +$ and should read:

$(C_{1-x1}N_{x1})$ (where $0 < a1 \leq 1$, $0 < b1 \leq 0.8$, $0 \leq d1 \leq 0.4$, $a1 + b1 +$ Column 2, line 34 reads:

$0 \leq d2 \leq 0.4$, and $a2 + B2 + d2 = 1$, but not $a1 = a2$, $b1 = b2$, and and should read:

$0 \leq d2 \leq 0.4$, and $a2 + b2 + d2 = 1$, but not $a1 = a2$, $b1 = b2$, and

Column 5, line 15 reads:

layers represented by $Ti_{a1}Al_{b1}Md_1(C_{1-x}N_{x1})$ (where $0 \leq a1 \leq 1$, and should read:

layers represented by $Ti_{a1}Al_{b1}Md_1(C_{1-x1}N_{x1})$ (where $0 < a1 \leq 1$, Signed and Sealed this
Thirty-first Day of May, 2016

Michelle K. Lee
*Director of the United States Patent and Trademark Office*

Column 7 (Table 2), lines 40 – 41 reads:

| Sample No. | Coating layer | | | Rake face | | | Flank face | | |
|---|---|---|---|---|---|---|---|---|---|
| | Composition | $Al_{DR}$ | $Al_{DR}/Al_{bR}$ | $Ra_R$ (μm) | $Rz_R$ (μm) | $Ti_{DF}$ | $Ti_{DF}/Ti_{aF}$ | $Ra_F$ (μm) | $Rz_F$ (μm) | and should read:

| Sample No. | Coating layer | | | Rake face | | | Flank face | | |
|---|---|---|---|---|---|---|---|---|---|
| | Composition | $Al_{DR}$ | $Al_{DR}/Al_{bR}$ | $Ra_R$ (μm) | $Rz_R$ (μm) | $Ti_{DF}$ | $Ti_{DF}/Ti_{aF}$ | $Ra_F$ (μm) | $Rz_F$ (μm) |

In the claims,

Column 12, line 24 reads:

coating layers comprising $Ti_{a2}Al_{b2}M_{d2}(C_{1-x2}N_{x2})$, where M and should read:

coating layers comprising $Ti_{a2}Al_{b2}M_{d2}(C_{1-x2}N_{x2})$, M

Column 12, line 28 reads:

but not a1=a2, not b1=b2, and not c1=c2 and should read:

but not a1=a2, not b1=b2, and not d1=d2